United States Patent [19]

Autran et al.

[11] 4,068,141
[45] Jan. 10, 1978

[54] TRANSDUCER FOR SURFACE WAVE FILTERS WITH AN ASYMMETRICAL TRANSFER FUNCTION

[75] Inventors: Jean Michel Autran; Bernard Epsztein, both of Paris, France

[73] Assignee: Thomson-CSF, Paris, France

[21] Appl. No.: 707,137

[22] Filed: July 20, 1976

[30] Foreign Application Priority Data

July 24, 1975 France .................................. 75.23139

[51] Int. Cl.² ............................................. H01L 41/04
[52] U.S. Cl. ........................................ 310/366; 333/72
[58] Field of Search .......................... 310/9.7, 8.1, 9.8; 333/30 R, 72

[56] References Cited

U.S. PATENT DOCUMENTS

| 3,626,309 | 12/1971 | Knowles | 333/72 X |
| 3,835,422 | 9/1974 | Hartemann | 333/72 |
| 3,968,460 | 7/1976 | Moulding | 310/9.8 X |
| 3,991,330 | 11/1976 | Isaacs | 310/9.8 X |

Primary Examiner—Mark O. Budd
Attorney, Agent, or Firm—Roland Plottel

[57] ABSTRACT

An input transducer for surface wave filters having an asymmetrical transfer function comprises two pairs (5 and 6) of interdigital combs disposed side by side on the same piezoelectric substrate staggered by one quarter of the acoustic wavelength, one having a symmetrical transfer function and the other an anti-symmetrical transfer function. The asymmetrical transfer function filter is obtained by summing the two acoustic waves generated by such an input transducer in a wide band output transducer.

4 Claims, 7 Drawing Figures

TRANSDUCER FOR SURFACE WAVE FILTERS WITH AN ASYMMETRICAL TRANSFER FUNCTION

This invention relates to an improved transducer for surface waves which may be used in the formation of surface wave filters with an asymmetrical transfer function, i.e. having neither symmetry nor antisymmetry about a central frequency Fo. The effect of this absence of symmetry or antisymmetry is that filters of this kind are generally said to have no central frequency.

It is known that surface wave filters can be formed by disposing on a block of piezoelectric material an input transducer formed by two interdigital electrodes or combs, the signal to be filtered being applied between the two electrodes of this transducer, and an output transducer collecting the waves generated at the surface of the piezoelectric material by the input transducer and propagated to the surface of that material.

It is also known that the transfer function T(F), F being the frequency of the signals to be filtered, of the filter thus formed depends upon the structure of its comb transucers and, in particular, upon the number, size and spacing of the fingers of the combs.

One known method of forming a filter with a predetermined transfer function T(F) consists in using an input transducer of which the fingers depend upon that transfer function and an output transducer comprising only two fingers, one for each comb. It is thus the input transducer which determines the transfer function of the filter, the sole function of the output transducer, which has a wide band because it has only two fingers, being to synthesize the signals which it receives from the input transducer. For this reason, and in the interests of simplicity, reference will be made hereinafter to the transfer function of the input transducer rather than to the transfer function of a filter comprising such an input transducer and a two finger wide band output transducer.

In order to obtain a predetermined transfer function, the input transducer has to have a pulse response I(t) of which the Fourier transform is the desired transfer function T(F).

To this end, the inverse Fourier transform of T(F), i.e. I(t), is calculated. The positions and values of the maxima of this function I(t) are determined and, by effecting the time-space transformation ($x = vt$, $v$ being the velocity of the soundwaves), there is formed an interdigital transducer which materializes the discrete sources placed at the maxima of I(x) with the suitable amplitudes. This latter operation uses the discrete source method or "delta" method which assimilates each pair of fingers of a transducer to an infinitely narrow ultrasonic generator localized on the median line between the two fingers. The amplitude of each discrete source is proportional to the overlap length of the two corresponding fingers, its sing being + or − according to the sense of the electrical field between the two fingers.

All these methods of synthesizing a filter are well known to the man skilled in the art and will not be described in any more detail here. They are described for example in a work by E. Dieulesaint and D. Royer entitled "Ondes elastiques dans les solids — Application au traitement du signal" (Elastic Waves in Solids — Application to Signal Processing), published by Editions Masson et Cie.

Generally, when it is desired to obtain a transfer function T(F) without a central frequency, i.e. having neither symmetry nor antisymmetry in relation to a central frequency Fo, the positions of the maxima of the function I(t), i.e. the positions of the discrete sources or even the spacing between the fingers of the input transducer of the filter are not disposed at regular intervals.

This gives rise to a certain number of significant disadvantages and for example to technological difficulties in forming close-set fingers or sources.

In addition, it is known that, in order to optimise the output of each discrete source, the width of each of the fingers corresponding to it has to be equal to the interval between these two fingers. In transducers where the interval between the fingers is not constant, this gives rise to different finger widths. Unfortunately, different finger widths such as these give rise to troublesome secondary effects when soundwaves pass below these fingers.

The object of the invention is to provide a transducer by which it is possible to obtain asymmetrical transfer functions like those obtained with transducers having irregular intervals, but without any of the disadvantages of transducers of that type. By virtue of a novel and original structure, a transducer according to the invention comprises only regularly spaced fingers of equal width.

A transducer according to the invention for a surface wave filter having an asymmetrical transfer function comprises two pairs of interdigital combs or electrodes disposed side by side on the same piezoelectric substrate to transmit acoustic waves along two parallel channels, these two pairs of combs being formed in such a way that they have transfer functions which are symmetrical (Ts) and antisymmetrical (Ta), respectively, in relation to a common central frequency (Fo) and being staggered by one quarter of the acoustic wavelength in the direction of propagation of the waves so that the acoustic waves transmitted by the pair of combs with the antisymmetrical transfer function are advanced by $\pi/2$ relative to the waves transmitted by the other pair of combs.

To obtain a filter with an asymmetric transfer function according to the invention, it is sufficient to dispose an input transducer of the type in question on a piezoelectric substrate, to apply the high frequency signal to be filtered for example between the two adjacent electrodes of two pairs of combs and the two most remote electrodes of these two pairs of combs and to collect the soundwaves transmitted by these two pairs of combs at a wide band output transducer comprising for example two fingers of which the length is sufficient for the waves travelling along the two channels corresponding to the two pairs of combs to be received by said output transducer.

Further objects, characteristics and results of the invention will become apparent from the following description given by way of example in conjunction with the accompanying drawings, wherein.

Figure 1:
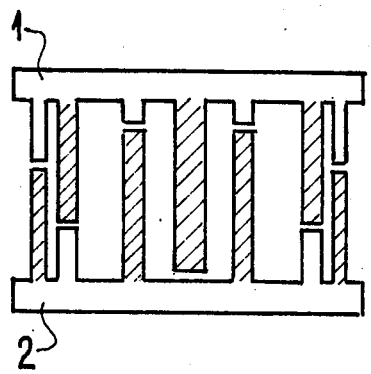
FIG. 1 is a diagrammatic view of a conventional transducer for an asymmetric transfer function.

FIG. 1 shows a conventional transducer by which it is possible to obtain a filter with an asymmetrical transfer function when, acting as an input transducer, it transmits soundwaves on a piezoelectric substrate to a wide-band output transducer. The high frequency signal to be filtered is applied between the two electrodes 1 and 2. The active fingers of these two electrodes, i.e. those between which appear the electrical fields generating surface waves on the substrate, are shown hatched both in this figure and also in the following figures. They are thus clearly distinguished from the dead fingers (non-hatched) which do not play a direct part in the transmission of soundwaves but which, conventionally, enable distorsion of the fronts of the waves transmitted to be avoided.

As already mentioned, it can be seen that the fingers are not separated from one another by constant intervals and that their widths (in the direction of travel of the waves) are different.

Figure 2:
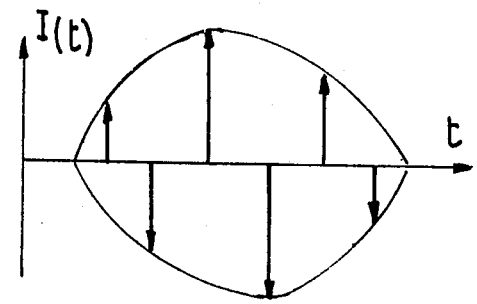
FIG. 2 shows the pulse response of that transducer.

FIG. 2 shows the pulse response I(t) of a transducer of this kind. There is an absence of symmetry of antisymmetry and the spacing between the maxima is not constant.

Figure 3:
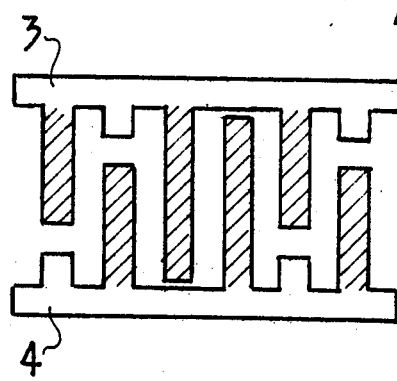
FIG. 3 is a diagrammatic view of a transducer for a symmetrical transfer function.
Figure 4:
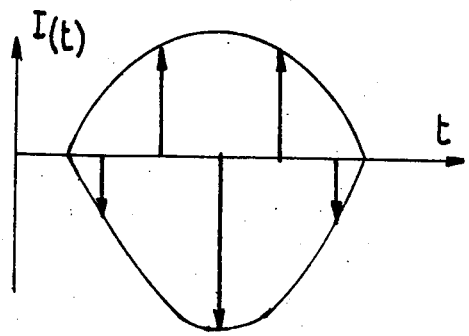
FIG. 4 shows the pulse response of that transducer.

FIG. 3 shows a conventional transducer for obtaining a filter with a symmetrical transfer function whilst FIG. 4 shows its pulse response. The uniformity of the spacing between the fingers of the two electrodes 3 and 4 and the constant width of these fingers are both clearly apparent, as is the constant distance between the maxima of the function I(t). This distance is equal to ½ Fo, Fo being the central frequency of the symmetrical transfer function which can be obtained with a filter such as this, i.e. the frequency which verifies the equality T(Fo−f) = T(Fo+f) in the band of the filter.

In the case of a transducer for an antisymmetrical transfer function, the spacing and width of the fingers would also be constant, and the spacing between the maxima of the pulse response would be constant and equal to ½ Fo with T(Fo−f) = −T(Fo+f).

Figure 5:
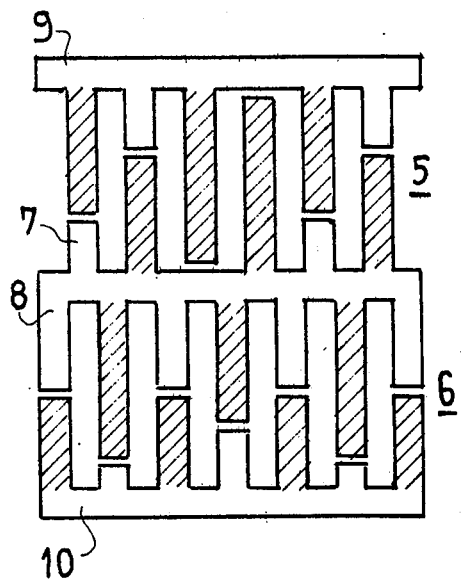
FIG. 5 is a diagrammatic view of a transducer according to the invention for an asymmetrical transfer function.
Figure 6:
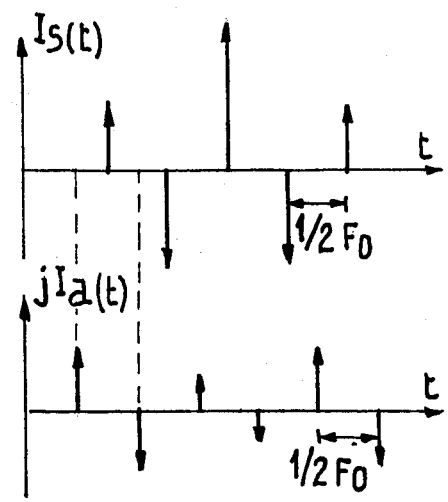
FIG. 6 shows the pulse response of the two pairs of combs of that transducer.

FIG. 5 diagrammatically illustrates one example of the transducer according to the invention for obtaining a filter with an asymmetrical transfer function.

Such a transducer comprises two pairs 5 and 6 of two combs or interdigital electrodes disposed side by side, the fingers of their electrodes being parallel.

In the example illustrated, the lower electrode 7 of the upper pair 5 and the upper electrode 8 of the lower pair 6 are joined by their horizontal part. An arrangement such as this is particularly simple to obtain, but is by no means imperative (cf. FIG. 7).

If a pulse is applied between the electrodes 7 and 8 on the one hand and 9 and 10 on the other hand, the pulse response Is(t) and jIa(t) shown in FIG. 5 are observed on each of the two parallel acoustic channels aligned respectively with each of the pairs of combs 5 and 6.

Whereas the pair 5 corresponds to a symmetrical transfer function, the pair 6 corresponds to an antisymmetrical transfer function. Accordingly, their pulse responses have maxima spaced at regular intervals of ½ Fo, Fo being the central frequency common to the two pairs of combs 5 and 6.

In addition, the two pairs 5 and 6 are disposed in such a way that the fingers of one are aligned with the interdigit spaces of the other, in other words the two pairs are staggered in the direction of travel of the waves by one quarter of the acoustic wavelength. Accordingly, the responses are in quadrature, the antisymmetrical response jIa(t) being in advance by π/2 relative to the symmetrical response Is(t).

When the two beams of acoustic waves thus transmitted by the two pairs of combs 5 and 6 are collected by a wide band output transducer disposed opposite the two propagation channels, they are added and the output transducer delivers a filtered signal corresponding to a transfer function ε(F) = Ts(F) + JTa(F), Ts(F) and jTa(F) being the Fourier transforms of the pulse responses Is(t) and jIa(t), i.e. an asymmetrical transfer function without a central frequency.

Thus, to obtain an input transducer for a filter having an asymmetrical transfer function according to the invention, i.e. in which all the fingers of the transducer are separated by the same spacing and have the same width, it is sufficient to divide the transfer function T(F) into the sum of a symmetrical function Ts and an antisymmetrical function Ta relative to a common frequency, which is possible for any function T(F), and then to form two pairs of combs 5 and 6 of which the pulse responses Is(t) and Ia(t) have the functions Ts(F) and Ta(F) and Ta(F) as Fourier transforms.

Figure 7:
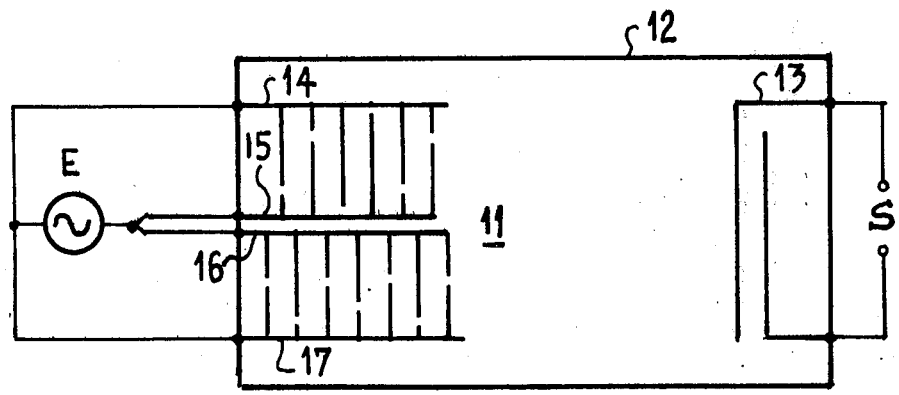
FIG. 7 is a diagrammatic view of a filter with an asymmetrical transfer function according to the invention.

FIG. 7 illustrates very diagrammatically a filter with an asymmetrical transfer function according to the invention.

A transducer 11 of the type illustrated in FIG. 5 is disposed at one end of a piezoelectric substrate 12, whilst a wideband output transducer 13 is disposed opposite it at the other end to collect all the waves transmitted by the transducer 11.

The high frequency signal to be filtered E is applied between the electrodes of the transducer 11. The filtered signal S is collected between the electrodes of the transducer 13.

It can be seen that the electrodes of 11 may be differently connected to the input signal. The electrode 14 may be connected to the electrode 16, the electrode 15 being connected to the electrode 17. In this case, it is necessary to invert two electrodes of one of the pairs 5 or 6 in regard to their configuration in order to obtain the same transfer function.

What is claimed is:

1. A transducer for a surface wave filter having an asymmetrical transfer function comprising two pairs of interdigital combs or electrodes disposed side by side on the same piezoelectric substrate to transmit acoustic waves along two parallel channels, these two pairs of combs having transfer functions which are symmetrical (Ts) and antisymmetrical (Ta), respectively, in relation to a common central frequency (Fo); said combs being staggered by one quarter of the acoustic wavelength in the direction of propagation of the waves so that the acoustic waves transmitted by the pair of combs with the antisymmetrical transfer function are advanced by π/2 relative to the waves transmitted by the other pair of combs.

2. A transducer as claimed in claim 1, wherein the two closest electrodes of the two pairs of combs are connected together and form a first input terminal of the transducer, whilst the two furthest electrodes form the second input terminal of the transducer.

3. A transducer as claimed in claim 2, wherein the fingers of said closest electrodes are respectively disposed on either side of a common conductive part elongated perpendicularly to said fingers.

4. A surface wave filter with an asymmetrical transfer function, comprising a transducer of the kind claimed in claim 1 disposed at one end of a piezoelectric substrate, and a wide band output transducer at the other end of said substrate, the length of the fingers of said output transducer being at least equal to the width of the two acoustic channels corresponding to the two pairs of combs of the input transducer.

* * * * *